(12) United States Patent
Teng et al.

(10) Patent No.: US 10,515,908 B2
(45) Date of Patent: Dec. 24, 2019

(54) SEAL RING FOR BONDED DIES

(71) Applicant: TAIWAN SEMICONDUCTOR MANUFACTURING CO., LTD., Hsinchu (TW)

(72) Inventors: Ya-Chun Teng, Tainan (TW); Sung-Yu Lin, Tainan (TW); Chien-Ming Sung, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/799,355

(22) Filed: Oct. 31, 2017

(65) Prior Publication Data

US 2019/0131255 A1 May 2, 2019

(51) Int. Cl.
| | | |
|---|---|---|
| H01L 23/34 | (2006.01) | |
| H01L 23/48 | (2006.01) | |
| H01L 21/00 | (2006.01) | |
| H01L 21/4763 | (2006.01) | |
| H01L 23/58 | (2006.01) | |
| H01L 23/00 | (2006.01) | |
| H01L 23/522 | (2006.01) | |
| H01L 21/78 | (2006.01) | |

(52) U.S. Cl.
CPC .......... H01L 23/585 (2013.01); H01L 21/78 (2013.01); H01L 23/5226 (2013.01); H01L 24/08 (2013.01); H01L 24/80 (2013.01); H01L 24/94 (2013.01); *H01L 2224/08145* (2013.01); *H01L 2224/80013* (2013.01); *H01L 2224/80203* (2013.01); *H01L 2224/80895* (2013.01); *H01L 2224/80896* (2013.01); *H01L 2224/80905* (2013.01)

(58) Field of Classification Search
CPC ... H01L 23/585; H01L 21/78; H01L 23/5226; H01L 24/08; H01L 24/80; H01L 24/94; H01L 24/83
See application file for complete search history.

(56) References Cited

U.S. PATENT DOCUMENTS

| | | | | |
|---|---|---|---|---|
| 9,972,603 | B2 * | 5/2018 | Chu | H01L 21/31111 |
| 2010/0171203 | A1 * | 7/2010 | Chen | H01L 23/585 |
| | | | | 257/686 |
| 2011/0127648 | A1 * | 6/2011 | Chen | H01L 21/78 |
| | | | | 257/620 |
| 2012/0001341 | A1 * | 1/2012 | Ide | H01L 23/473 |
| | | | | 257/773 |
| 2012/0241981 | A1 * | 9/2012 | Hirano | H01L 23/522 |
| | | | | 257/777 |
| 2014/0124889 | A1 * | 5/2014 | Qian | H01L 27/14618 |
| | | | | 257/448 |
| 2016/0190103 | A1 * | 6/2016 | Kabe | H01L 24/06 |
| | | | | 257/777 |

* cited by examiner

*Primary Examiner* — Alonzo Chambliss
(74) *Attorney, Agent, or Firm* — Maschoff Brennan

(57) ABSTRACT

A device includes first and second dies and a seal ring. The first die includes a top dielectric layer. The second die is over the first die. The second die includes a bottom dielectric layer bonded to the top dielectric layer of the first die at an interface between the first die and the second die. The seal ring extends from the first die to the second die through the interface. A portion of the top dielectric layer of the first die and a portion of the bottom dielectric layer of the second die are separated by a gap outside the seal ring.

20 Claims, 14 Drawing Sheets

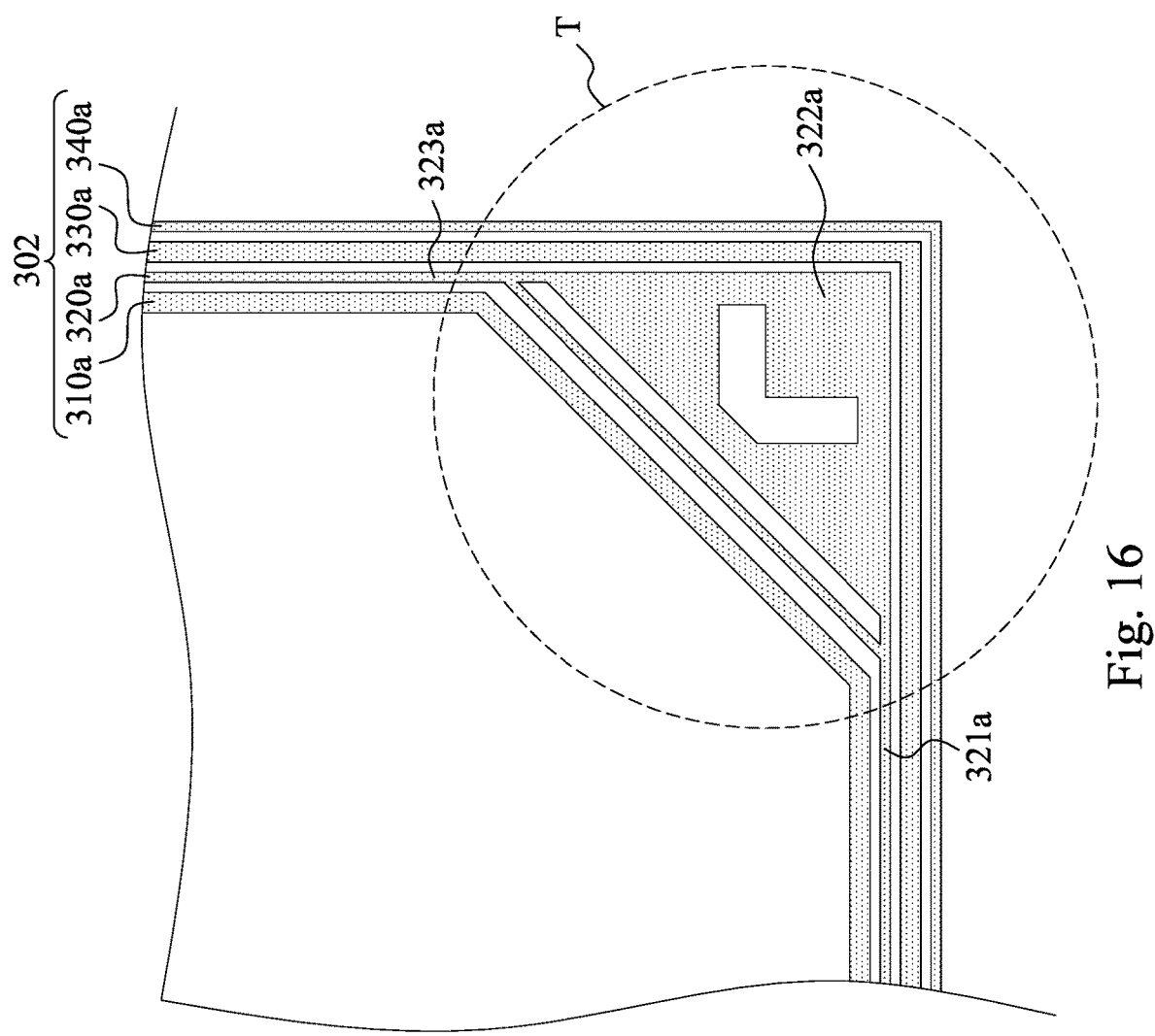

SEAL RING FOR BONDED DIES

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The vertical integration of two-dimensional (2D) ICs into three-dimensional (3D) ICs has emerged as a potential approach to improving processing capabilities and power consumption of ICs. By vertically integrating 2D ICs into 3D ICs, footprints are reduced and metal interconnect distance is shortened, thereby improving processing capabilities and reducing power consumption. Wafer-to-wafer bonding technology has been developed to bond two wafers together, such that the 2D ICs in the respective wafers can be integrated into 3D ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 is a top view of the seal ring as shown in FIG. 15 without illustrating the second IC die.

DETAILED DESCRIPTION

Figure 1:
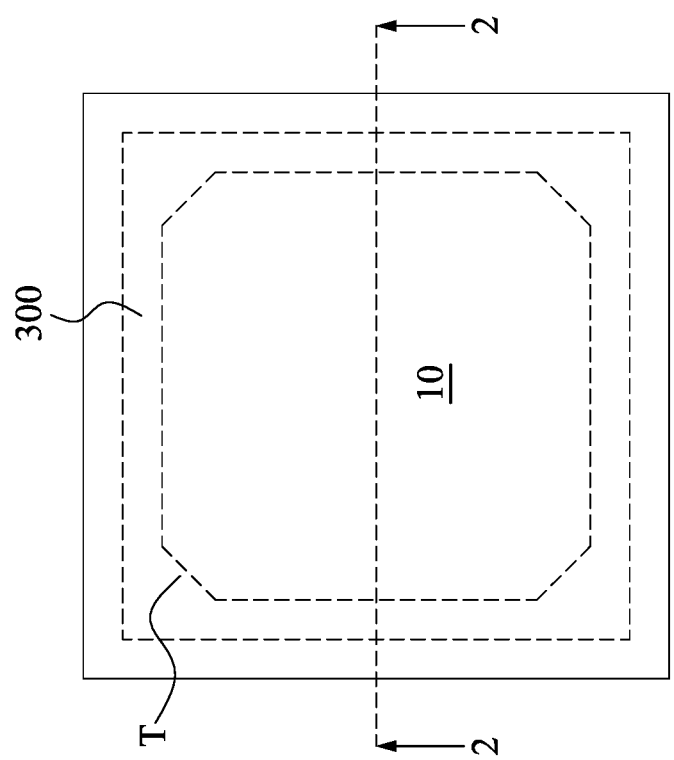
FIG. 1 is a schematic plan view of a three-dimensional (3D) integrated circuit (IC) with a seal ring in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
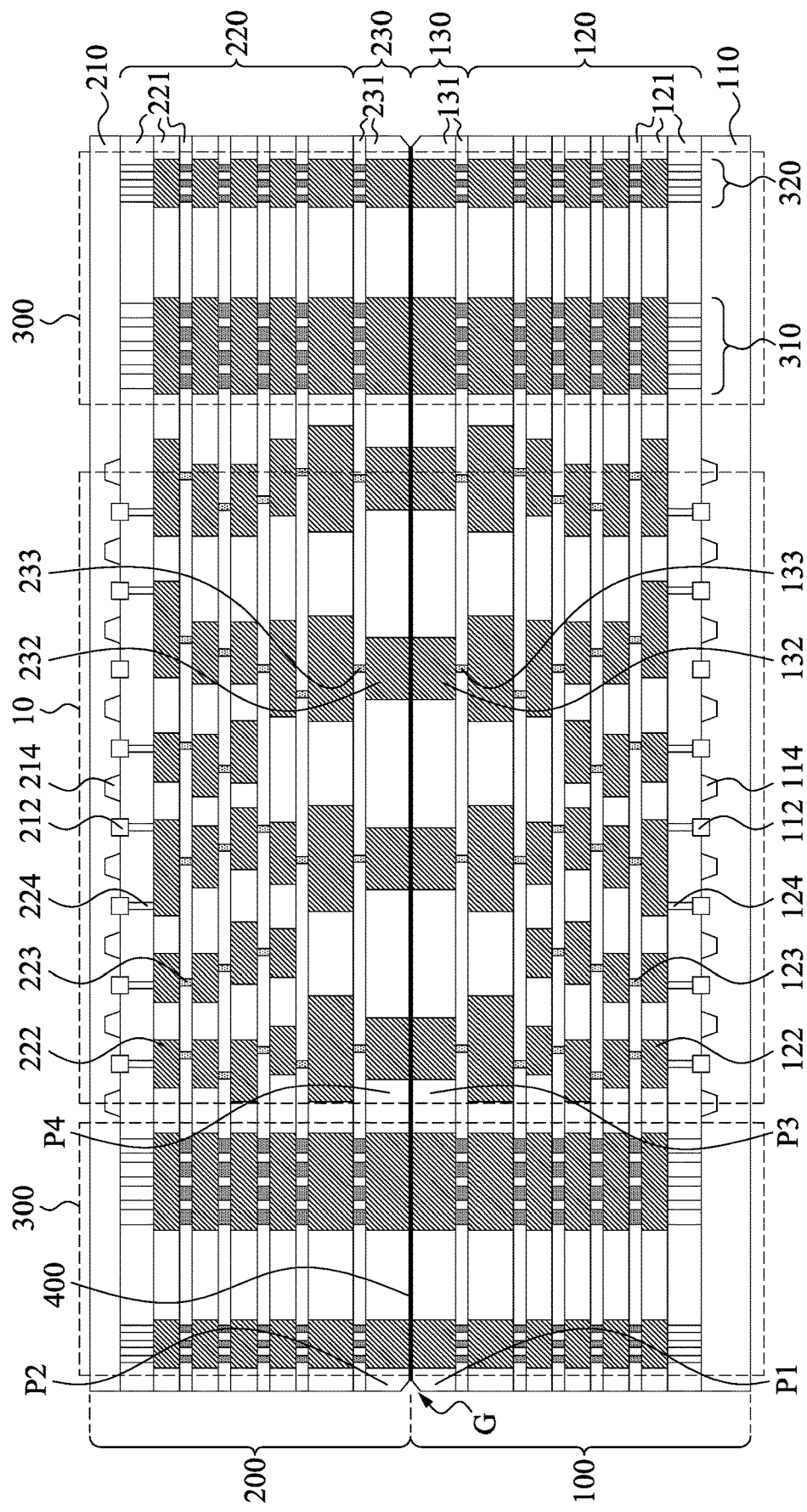
FIG. 2 is a cross-sectional view taken along line 2-2 in FIG. 1.

FIG. 1 is a schematic plan view of a three-dimensional (3D) integrated circuit (IC) 10 with a seal ring 300 in accordance with some embodiments of the present disclosure. FIG. 2 is a cross-sectional view taken along line 2-2 in FIG. 1. As illustrated in FIGS. 1 and 2, a first IC die 100 supports a second IC die 200. The first and second IC dies 100 and 200 are 2D IC dies and respectively comprise first and second semiconductor substrates 110 and 210. The first and second semiconductor substrates 110 and 210 are spaced from one another, respectively under and over the seal ring 300. In some embodiments, the first IC die 100 is an application specific integrated circuit (ASIC) die, and the second IC die 200 is a system on chip (SoC) die. In some embodiments, the first and second semiconductor substrates 110 and 210 are bulk substrates of monocrystalline silicon or some other semiconductor, some other type of semiconductor substrate, or a combination of the foregoing. Further, in some embodiments, the semiconductor substrates 110 and 210 have respective thicknesses that are different. For example, a first semiconductor substrate 110 of the first IC die 100 may have a thickness greater than a thickness of a second semiconductor substrate 210 of the second IC die 200.

The 3D IC 10 is defined with the first and second IC dies 100 and 200, and includes a plurality of first and second semiconductor devices 112, 212 and interconnect structures between the first and second semiconductor substrates 110 and 210. In some embodiments, the semiconductor devices are active and/or passive devices. For example, the semiconductor devices may comprise metal-oxide-semiconductor field-effect transistors (MOSFETs) such as planar transistors, finFETs or gate all around (GAA) transistors formed on the first semiconductor substrate 110 and/or the second semiconductor substrate 210. As another example, the semiconductor devices may comprise metal-insulator-metal (MIM) capacitors, resistive random-access memory (RRAM), or spiral inductors arranged in the interconnect structures between the first and second semiconductor substrates 110 and 210. Further, in some embodiments, first isolation regions 114 are arranged in the first semiconductor substrate 110 to provide electrical isolation between the first semiconductor devices 112. Similarly, second isolation regions 214 are arranged in the second semiconductor substrate 210 to provide electrical isolation between the second semiconductor devices 212. At least one of the first and second isolation regions 114 and 214 may be, for example, a shallow trench isolation (STI) region or a deep trench isolation (DTI) region.

The first and second IC dies 100 and 200 respectively include first and second interconnect structures 120 and 220 between the first and second semiconductor substrates 110 and 210. The first interconnect structure 120 of the first IC die 100 includes first interlayer dielectric (ILD) layers 121, first wiring structures 122, first inter-wire via structures 123, and a first device contact structure 124. Similarly, a second interconnect structure 220 of the second IC die 200 comprises a plurality second ILD layers 221, second wiring structures 222, second inter-wire via structures 223, and a second device contact structure 224. The first and second ILD layers 121 and 221 may be, for example, silicon dioxide, a low k dielectric, some other dielectric, or a combination of the foregoing. As used here, a low k dielectric is a dielectric with a dielectric constant k less than about 3.9.

The first wiring structures 122 are alternatingly stacked with the first inter-wire via structures 123 and the device contact structure 124 in the first ILD layers 121, such that the first device contact structure 124 is in contact with the semiconductor devices 112 formed on the first semiconductor substrate 110. Similarly, the second wiring structures 222 are alternatingly stacked with the second inter-wire via structures 223 and the device contact structure 224 in the second ILD layers 221, such that the second device contact structure 224 is in contact with the semiconductor devices 212 formed on the second semiconductor substrate 210. The first and second wiring structures 122 and 222 are made up of wires, the first and second inter-wire via structures 123 and 223 are made up of inter-wire vias, and the first and second device contact structures 124 and 224 are made up of device contact plugs. Further, the first and second wiring structures 122 and 222, the first and second inter-wire via structures 123 and 223, and the first and second device contact structures 124 and 224 are conductive and may be, for example, aluminum copper, copper, aluminum, tungsten, some other metal or conductive material, or a combination of the foregoing.

In some embodiments, a lowest wiring structure 122L of the first wiring structures 122 and a highest wiring structure 122H of the first wiring structures 122 are arranged in a direction from the first semiconductor substrate 110 toward the second semiconductor substrate 210, and the highest first wiring structure 122H is thicker than the lowest first wiring structure 122L. In some embodiments, a lowest wiring structure 222L of the second wiring structures 222 and a highest wiring structure 222H of the second wiring structures 222 are arranged in the direction from the first semiconductor substrate 110 toward the second semiconductor substrate 210, and the lowest second wiring structure 222L is thicker than the highest second wiring structure 222H.

In some embodiments, the first wiring structures 122 are integrated respectively with, and/or the same materials respectively as, immediately underlying layers of the first inter-wire via and device contact structures 123 and 124. In other embodiments, the first wiring structures 122 are distinct respectively from, and/or different materials respectively than, immediately underlying layers of the first inter-wire via and device contact structures 123 and 124. Similarly, in some embodiments, the second wiring structures 222 are integrated respectively with, and/or the same materials respectively as, immediately overlying layers of the second inter-wire via and device contact structures 223 and 224. In other embodiments, the second wiring structures 222 are respectively distinct from, and/or different materials respectively than, immediately overlying layers of the second inter-wire via and device contact structures 223 and 224.

In some embodiments, the first and second IC dies 100 and 200 respectively comprise first and second hybrid bond (HB) structures 130 and 230 between the first and second interconnect structures 120 and 220 and contact at a HB interface 400. The first HB structure 130 comprises a plurality of first HB dielectric layers 131, a first HB link layer 132 in one first HB dielectric layer 131, and a first HB contact structure 133 in another first HB dielectric layer 131. The second HB structure 230 comprises a plurality of second HB dielectric layers 231, a second HB link layer 232 in a one second HB dielectric layer 231, and a second HB contact structure 233 in another second HB dielectric layer 231. In some embodiments, the lowest first wiring structure 122L and the first HB link layer 132 are arranged in a direction from the first semiconductor substrate 110 toward the second semiconductor substrate 210, and the first HB link layer 132 is thicker than the lowest first wiring structure 122L. In some embodiments, the second HB link layer 232 and the highest second wiring structure 222H are arranged in the direction from the first semiconductor substrate 110 toward the second semiconductor substrate 210, and the second HB link layer 232 is thicker than the highest second wiring structure 222H.

The first and second HB dielectric layers 131 and 231 contact at the HB interface 400 to define a dielectric-to-dielectric interface. For example, the hybrid bond between the first and second IC dies 100 and 200 comprises a dielectric-to-dielectric bond between the a top one of the first HB dielectric layers 131 and a bottom one of the second HB dielectric layers 231, so as to bond the first and second HB dielectric layers 131 and 231 together. In some embodiments, the top one of the first HB dielectric layers 131 can be referred to as a top dielectric layer of the first IC die 100, and the bottom one of the second HB dielectric layers 231 can be referred to as a bottom dielectric layer of the second IC die 200. In some embodiments, the first and second HB dielectric layers 131 and 231 may be, for example, silicon dioxide, some other dielectric, or a combination of the foregoing.

The first and second HB link layers 132 and 232 are embedded respectively into the first and second HB dielectric layers 131 and 231, such that the first and second HB link layers 132 and 232 are respectively and substantially flush with the first and second HB dielectric layers 131 and 231 at the HB interface 400. Further, the first and second HB link layers 132 and 232 contact at the HB interface 400 to define a conductor-to-conductor interface, and are electrically coupled to the first and second interconnect structures 120 and 220, respectively, by the first and second HB contact structures 133 and 233. For example, the hybrid bond between the first and second IC dies 100 and 200 comprises a conductor-to-conductor bond between the first and second HB link layers 132 and 232 so as to bond the first and second HB link layers 132 and 232 together. The first and second HB link layers 132 and 232 are conductive and may be, for example, metal such as aluminum copper, copper, aluminum, tungsten, some other conductive material, or a combination of the foregoing. In some embodiments where the first and second HB link layers 132 and 232 are metals, the bond between the HB link layers 132 and 232 is a metal-to-metal bond.

As described above, in some embodiments, the first and second HB dielectric layers 131 and 231 can be referred to as first and second dielectric structures, the first and second HB link layers 132 and 232 can be referred to as first and second conductive structures respectively in the first and second dielectric structures 131 and 231. A hybrid bond is formed at an interface 400 between the first and second dies 100 and 200, and it includes a dielectric-to-dielectric bond that bonds the first and second dielectric structures 131 and 231 together, and a conductor-to-conductor bond (e.g. metal-to-metal bond) that bonds the first and second conductive structures 132 and 232 together.

The first and second HB contact structures 133 and 233 extend respectively from the first and second HB link layers 132 and 232 respectively to the first and second interconnect structures 120 and 220. The first and second HB contact structures 133 and 233 are conductive and may be, for example, aluminum copper, copper, aluminum, tungsten, some other conductive material, or a combination of the foregoing.

In some embodiments, a first HB link layer 132 of the first IC die 100 is integrated with, and/or the same material as, a first HB contact structure 133 of the first IC die 100. In other embodiments, the first HB link layer 132 is distinct from, and/or a different material than, the first HB contact structure 133. Similarly, in some embodiments, a second HB link layer 232 of the second IC die 200 is integrated with, and/or the same material as, a second HB contact structure 233 of the second IC die 200. In other embodiments, the second HB link layer 232 is distinct from, and/or a different material than, the second HB contact structure 233.

The seal ring 300 is in the first and second IC dies 100 and 200 and is defined in part by the first and second HB link layers 132 and 232, so that the seal ring 300 extends from the first IC die 100 to the second IC die 200 through the HB interface 400 to laterally encloses the HB interface 400 in the 3D IC 10. Therefore, the seal ring 300 defines a wall or barrier protecting the first and second HB dielectric layers 131 and 132 in the 3D IC 10 from delamination. For example, an outer portion P1 of a top one of the first HB dielectric layers 131 and an outer portion P2 of a bottom one of the second HB dielectric layers 231 extend along an outer side of the seal ring 300. The outer dielectric portions P1 and P2 can be in combination referred to as a dielectric ring enclosing the seal ring 300. During and/or after a die saw process in fabricating the 3D IC 10, the dielectric ring is close to a scribe line region (not shown) and thus the outer dielectric portions P1 and P2 may delaminate from each other, such that these outer dielectric portions P1 and P2 are separated by a gap G. Since the HB interface 400 in the 3D IC 10 is enclosed by the seal ring 300, the seal ring 300 can be in between the scribe line region and the HB interface 400 in the 3D IC 10. As a result, the gap G does not extend into the HB interface 400 in the 3D IC 10 due to the seal ring 300. Therefore, delamination of an inner portion P3 of the first HB dielectric layer 131 and an inner portion P4 of the second HB dielectric layer 231 enclosed by the seal ring 300 can be prevented.

Figure 4:
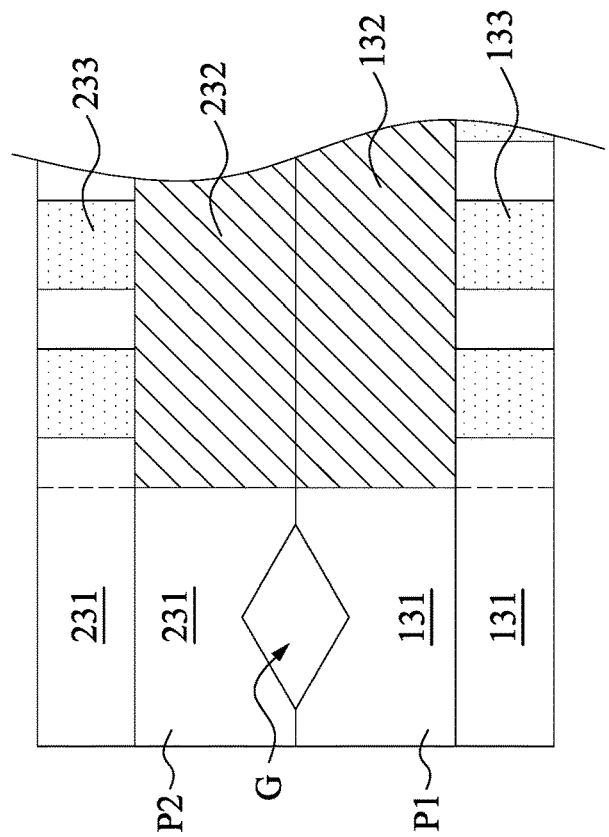
FIG. 4 illustrates a gap outside a seal ring in accordance with some embodiments of the present disclosure.
Figure 3:
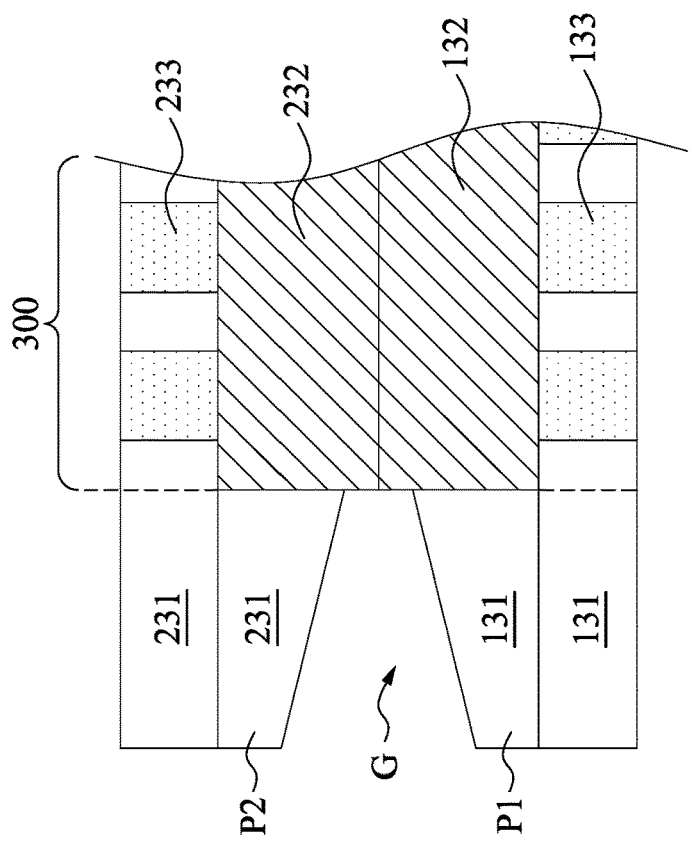
FIG. 3 illustrates a gap outside a seal ring in accordance with some embodiments of the present disclosure.

In some embodiments, even if the outer portions P1 and P2 of the first and second HB dielectric layers 131 and 231 suffer from delamination as illustrated in FIG. 3, the seal ring 300 can still block the gap G from extending into the inner portions P3 and P4 (as shown in FIG. 2) of the first and second HB dielectric layers 131 and 231. In this situation, the gap G extends between the outer portions P1 and P2 of the first and second HB dielectric layers 131 and 231 and terminates at the seal ring 300. By way of example, the gap G has a width along the X direction, and the width of the gap G is in a range from about 50 μm to about 100 μm. In some embodiments, the gap G has a trapezoid shape. In some embodiments, the gap G has a triangular shape. In such embodiments, the outer side of the seal ring 300 is exposed to the gap G. In some embodiments, the gap G only exposes either the first HB link layer 132 or the second HB link layer 232. In some embodiments, the gap G stops before the seal ring 300. In some embodiments, the gap G is formed as a bubble in a combined structure of the outer portions P1 and P2 if the gap G is sealed in the combined structure, as illustrated in FIG. 4. In at least one embodiment, the gap G has a diamond shape.

In some embodiments, as illustrated in FIG. 1, the seal ring 300 has a triangular pattern or triangular structure T at a corner region of the seal ring 300. In some embodiments, the seal ring 300 has the triangular pattern T in a cross section taken along the HB interface 400 (as shown in FIG. 2). Stated in another way, the seal ring 300 has the triangular pattern T at a top surface of the first IC die 100 and/or at a bottom surface of the second IC die 200. For example, the triangular pattern T is formed by the first and second HB link layers 132 and 232. Such a triangular pattern T provides for increased prevention of delamination at the corner of the 3D IC 10, which has been more susceptible to delamination from a die saw process. For example, the seal ring 300 has greater width at its corner than at its sides due to the triangular pattern T, and hence delamination at the corner of the seal ring 300 can be further prevented.

In some embodiments, as shown in FIG. 2, the seal ring 300 extends from the first semiconductor substrate 110 to the second semiconductor substrate 210, such that the seal ring 300 defines a wall or barrier protecting the 3D IC 10, as illustrated in FIG. 1. For example, the seal ring 300 defines a conductive path through the first and second HB structures 130 and 230. In some embodiments, the seal ring 300 further defines a conductive path from the first semiconductor substrate 110 to the second semiconductor substrate 210 through the first and second interconnect structures 120, 220 and the first and second HB structures 130 and 230.

In some embodiments, the seal ring 300 is made up of one or more ring-shaped structures 310 and 320 that are concentrically aligned. The ring-shaped structures 310 and 320 each laterally enclose the HB interface 400 in the 3D IC 10. The ring-shaped structures 310 and 320 are each defined with the first and second HB link layers 132, 232 and the first and second HB contact structures 133 and 233. Further, the ring-shaped structures 310 and 320 are each defined with the first and second wiring structures 122, 222 and the first and second inter-wire via structures 123, 223, and the first and second device contact structures 124, 224. For example, an inner ring-shaped structure 310 may be defined by an alternating stack of device contacts in the device contact structures 124, 224, inter-wire vias in the inter-wire via structures 123, 223, and ring-shaped wires in the wiring structures 122, 222 in the interconnect structures 120, 220, as well as HB contacts and ring-shaped HB links in the first and second HB structures 130, 230. Advantageously, since inner and outer ring-shaped structures 310 and 320 are each further defined with the first and second wiring structures 122, 222 and the first and second inter-wire via structures 123, 223, and the first and second device contact structures 124 and 224, the seal ring 300 may define a continuous wall or barrier from the first semiconductor substrate 110 to the second semiconductor substrate 210, such that protection for the 3D IC 10 can be further improved. In some embodiments, the outer ring-shaped structure 320 and/or the inner ring-shaped structure 310 are void free, and hence a further improved protection can be provided for the 3D IC.

Figure 5:
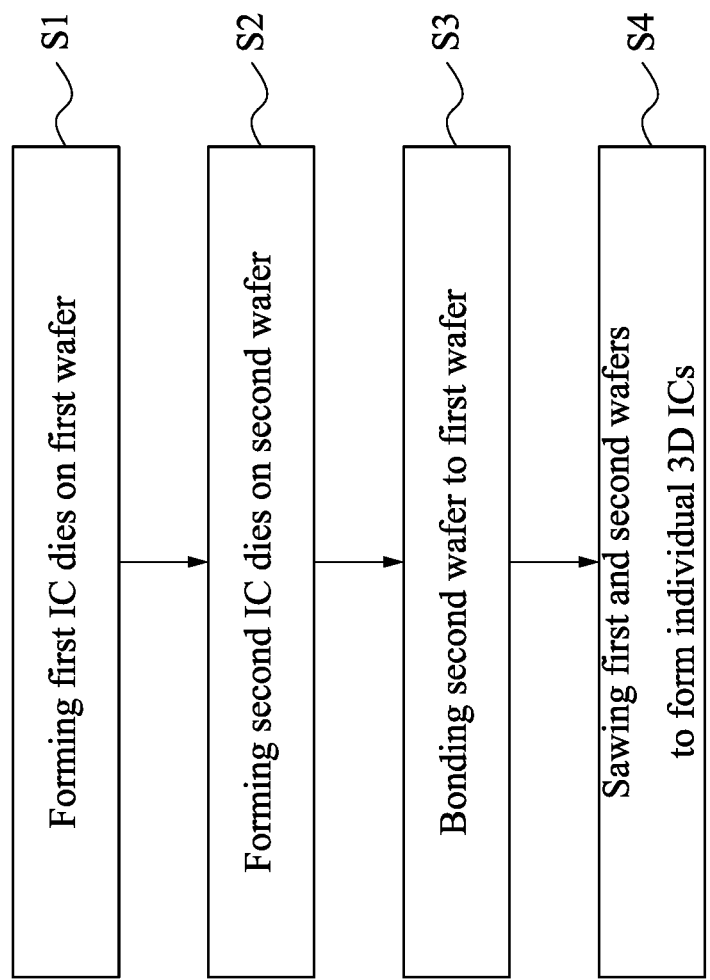
FIG. 5 depicts a flow chart of a method of fabricating of 3D ICs in accordance with embodiments of the present disclosure.
Figure 10:
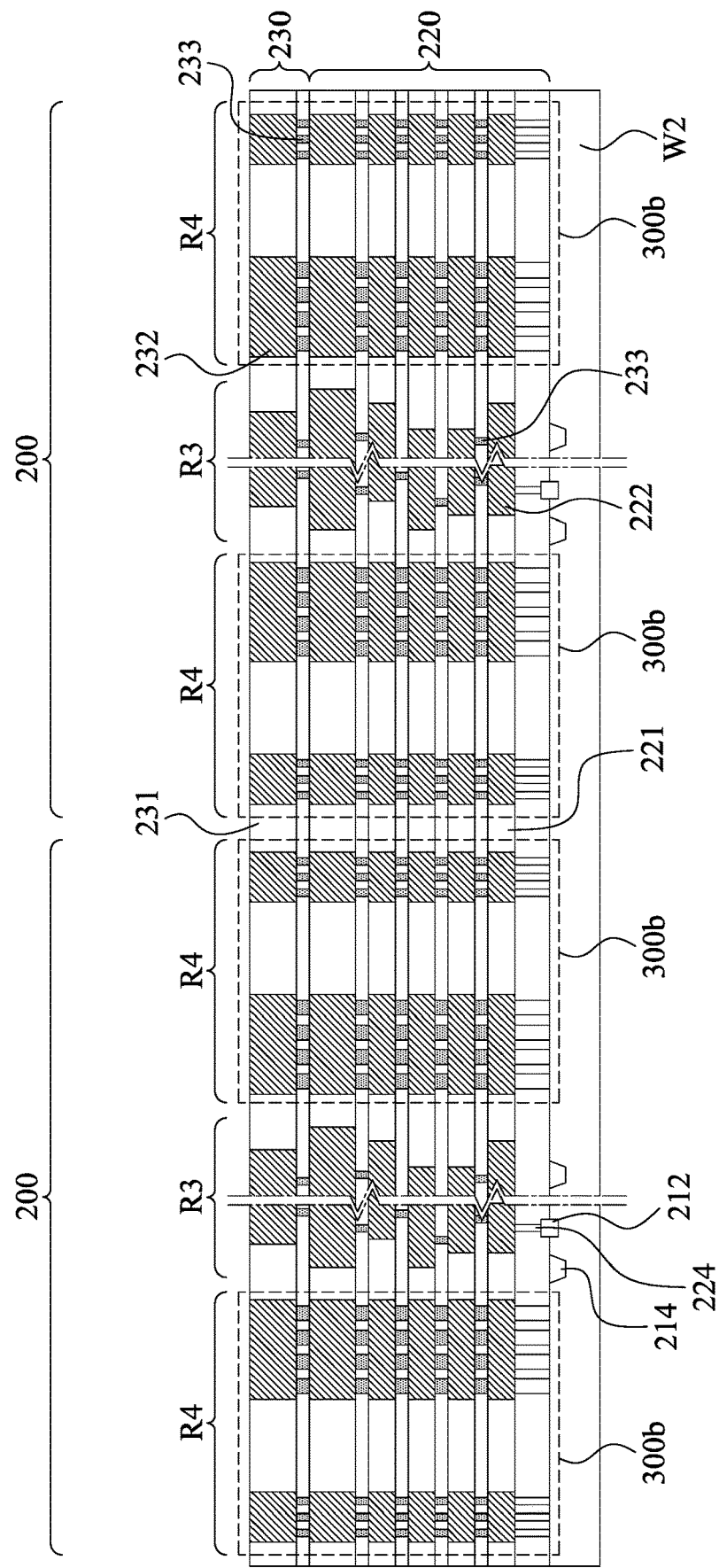
Figure 11:
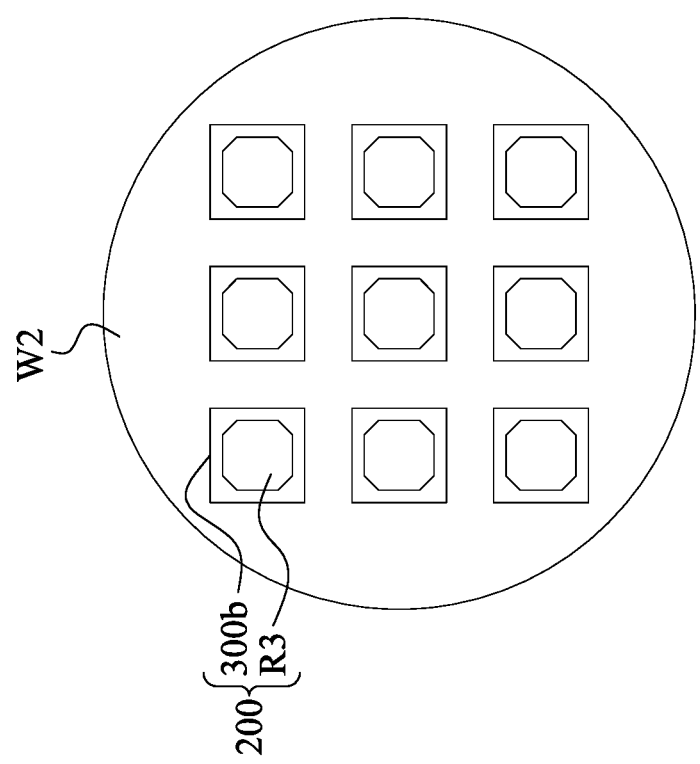
Figure 12:
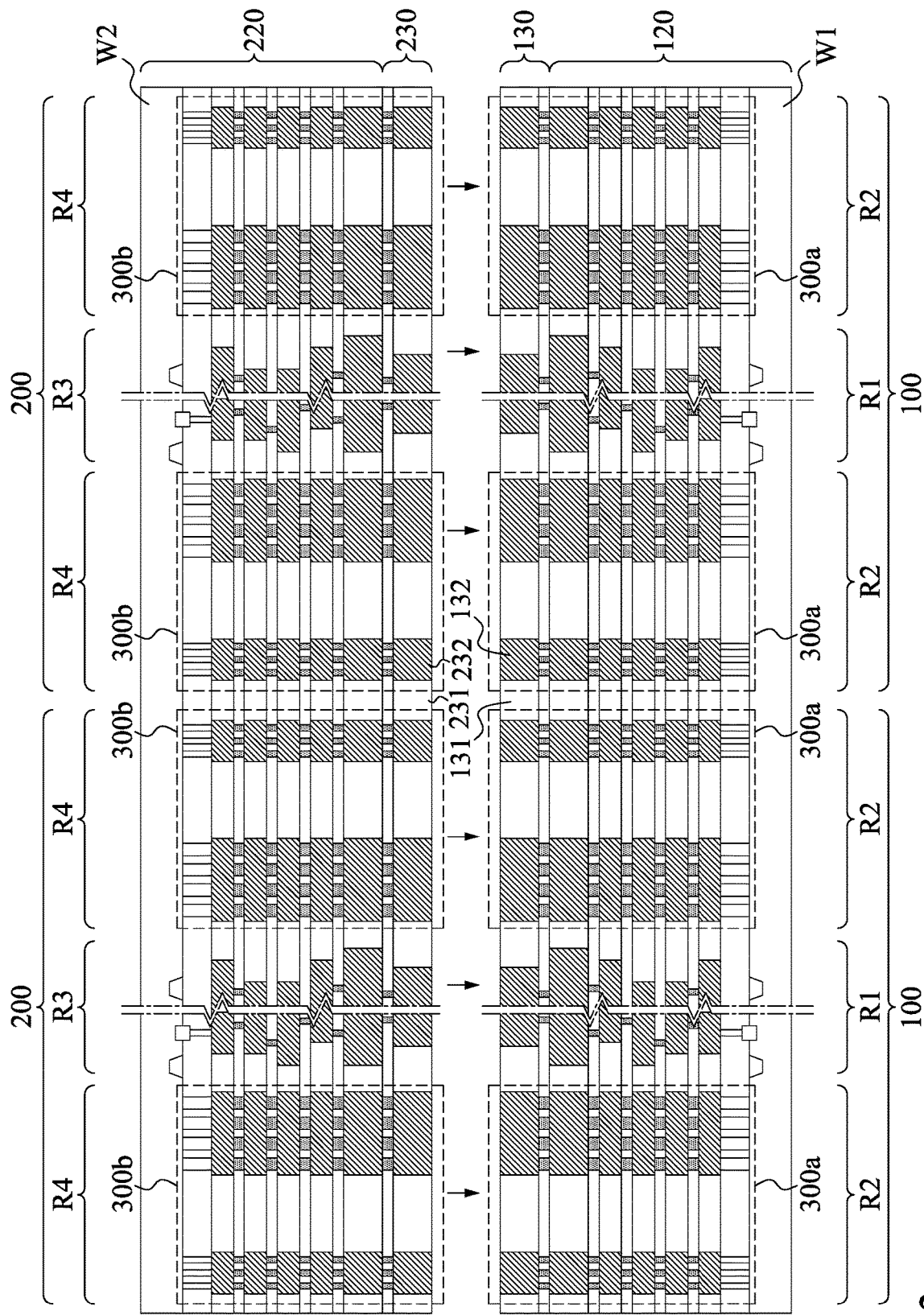
Figure 13:
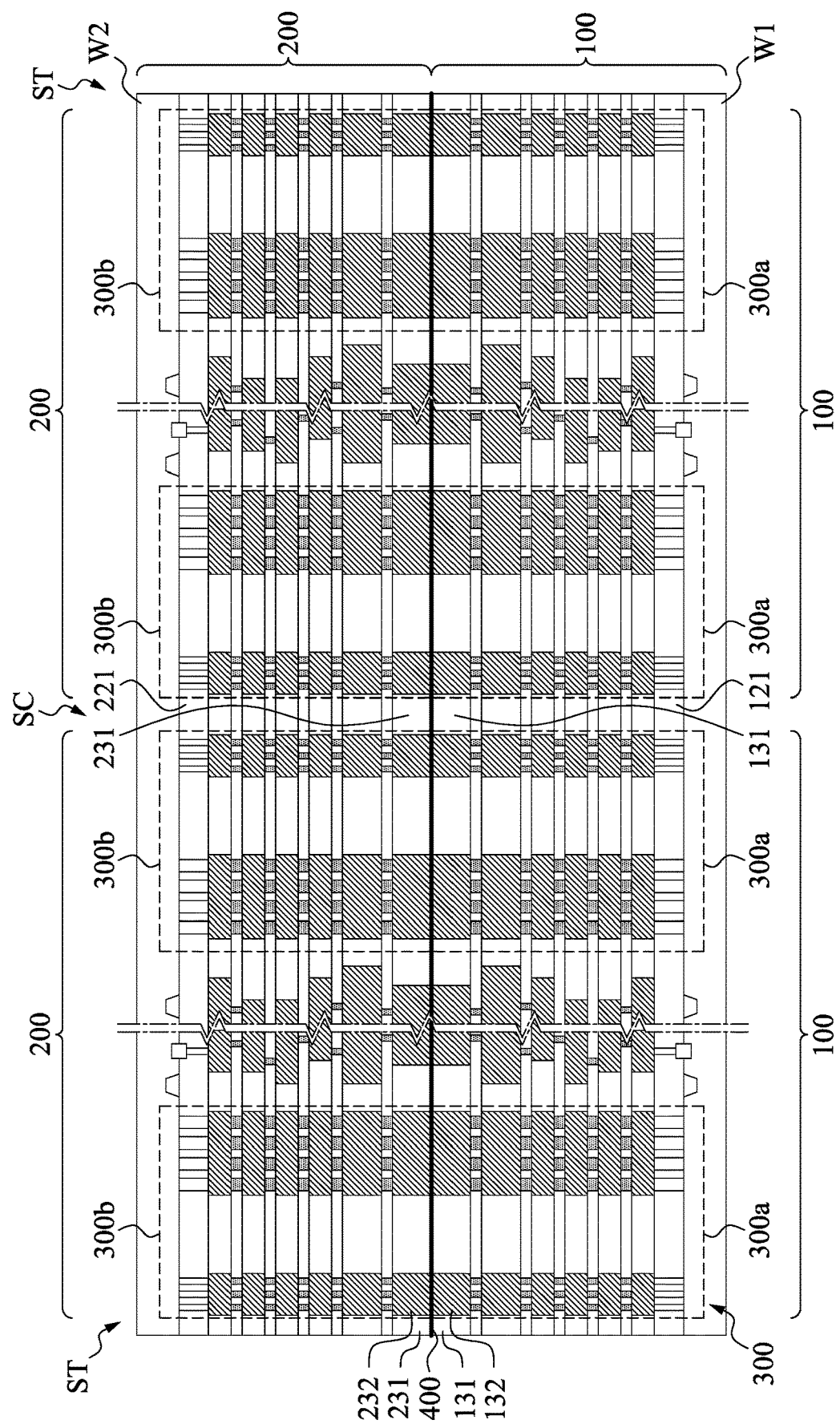
Figure 14:
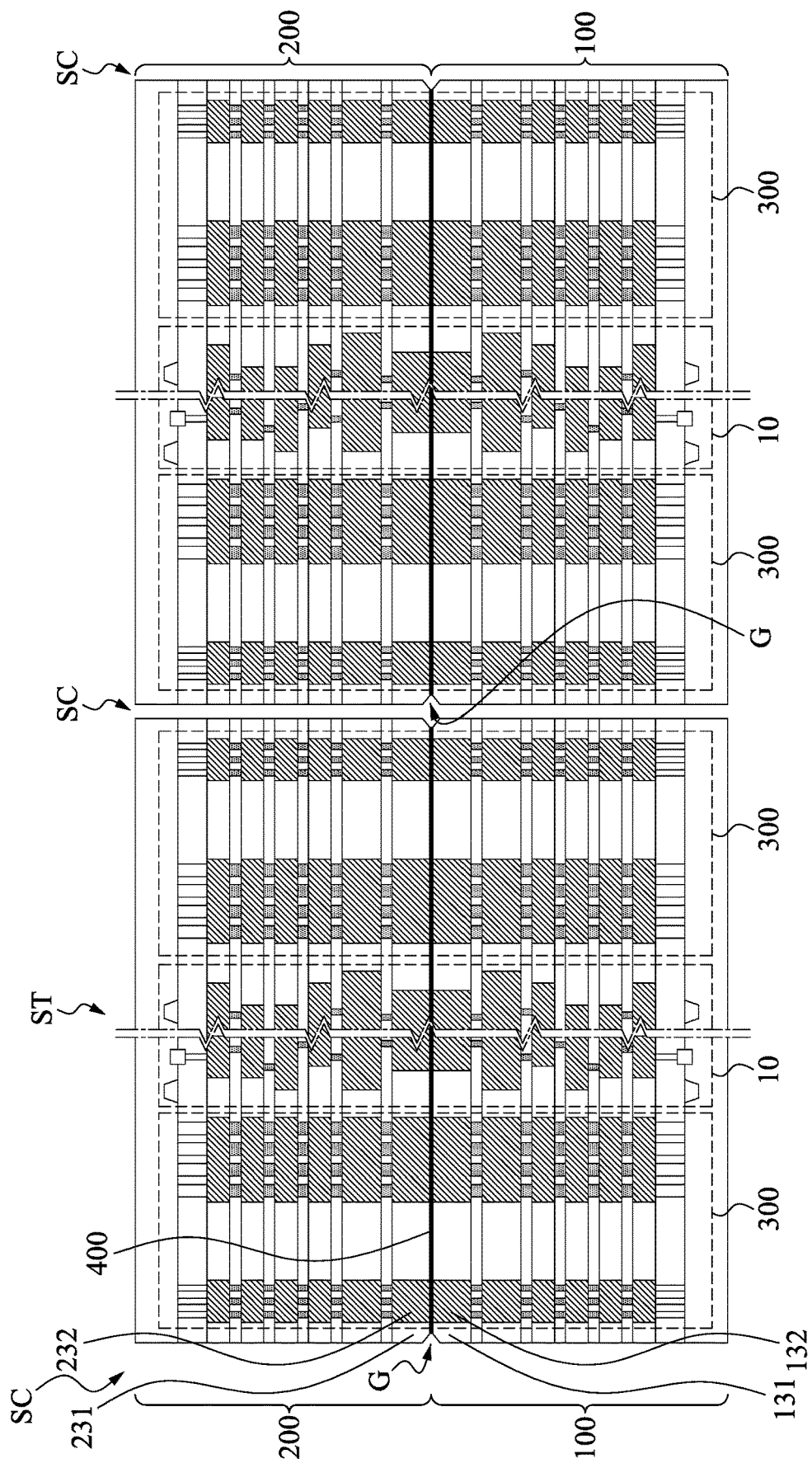

FIG. 5 depicts a flow chart of a method of fabricating of 3D ICs in accordance with embodiments of the present disclosure. The method is illustrated as including several enumerated steps. Various embodiments of the method may include additional steps before, after, in between, and/or as part of the enumerated steps. The method begins with operation S1 in which first IC dies are formed on a first wafer (as shown in FIGS. 6-9). The method continues with operation S2 in which second IC dies are on a second wafer (as shown in FIGS. 10 and 11). The method continues with operation S3 in which the second wafer is bonded to the first wafer (as shown in FIGS. 12 and 13). The method continues with operation S4 in which the first and second wafers are sawed to form individual 3D ICs (as shown in FIG. 14).

Figure 6:
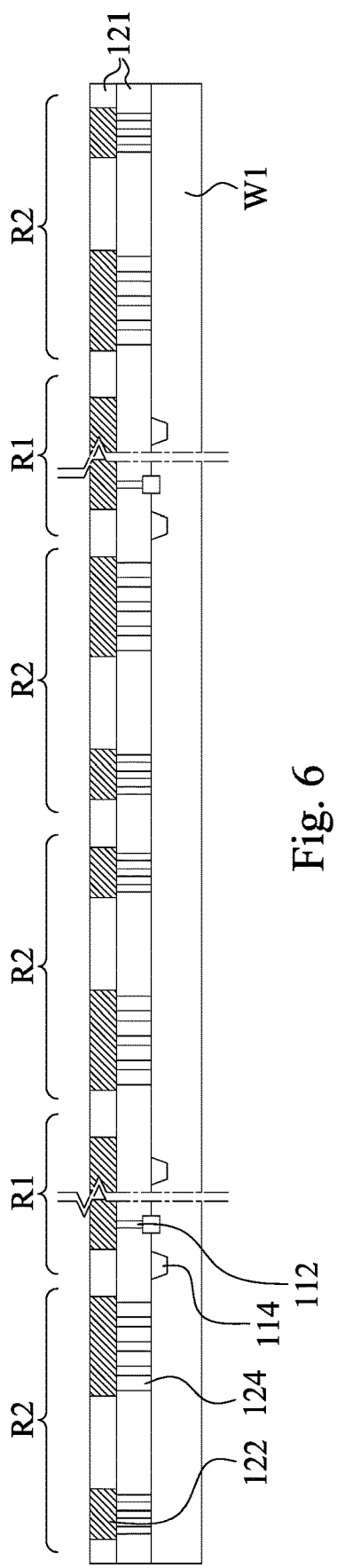
FIGS. 6 through 14 illustrate fabrication of 3D ICs in accordance with embodiments of the present disclosure.

FIGS. 6 through 14 illustrate intermediate stages during fabrication of 3D ICs in accordance with embodiments of the present disclosure. As shown in FIG. 6, first isolation regions 114 are formed in device regions R1 of a first wafer W1. Exemplary formation of the first isolation regions 114 includes forming trenches in the first wafer W1 using a suitable etch process and then forming a dielectric material in the trenches using a suitable deposition process. Semiconductor devices 112 are formed in the device regions R1 of the first wafer W1. Formation of the semiconductor devices 112 may be a gate late process that includes, for example, forming dummy gate structures on the first wafer W1, forming gate spacers along sidewalls of the dummy gate structures, forming source/drain regions in the device regions R1 of the first wafer W1 and adjacent to the gate spacers, removing the dummy gate structures to form gate trenches, and forming metal gates in the gate trenches.

After formation of the semiconductor devices 112, first ILD layers 121 are formed over a first semiconductor substrate 110. For example, a lower layer of the first ILD layers 121 is formed covering the first wafer W1, and an upper layer of the first ILD layers 121 is subsequently formed covering the lower layer. The first ILD layers 121 are formed stacked and may, for example, be formed by vapor deposition (e.g., chemical or physical vapor deposition), atomic layer deposition, thermal oxidation, some other growth or deposition process, or a combination of the foregoing. Further, the first ILD layers 121 may be formed of, for example, silicon dioxide, a low k dielectric, some other dielectric, or the like.

In some embodiments, an etch stop layer (not shown) is formed between the first ILD layers 121. The etch stop layer is a different material than the first ILD layers 121 and may be, for example, silicon nitride, silicon oxynitride or the like. Further, in some embodiments, the first ILD layers 121 are integrated together and/or are the same material. For example, the first ILD layers 121 may be different regions of the same deposition or growth.

A first wiring structure 122 and a first device contact structure 124 are formed respectively in the first ILD layers 121. For example, the first wiring structure 122 may be formed embedded into an upper layer of the first ILD layers 121, and the first device contact structure 124 may be formed extending from the first wiring structure 122, through the lower layer of the first ILD layers 121, to the first wafer W1 or the semiconductor devices 112. The first wiring structure 122 and the first device contact structure 124 are further formed in ring-shaped regions R2 enclosing respective device regions R1. The portions of the first wiring structure 122 and the first device contact structure 124 in the ring-shaped regions R2 are formed with a pattern of a seal ring (e.g. the seal ring 300 as shown in FIGS. 1 and 2).

In some embodiments, the process for forming the first wiring structure 122 and the first device contact structure 124 comprises performing a first selective etch into the upper layer of the first ILD layers 121 to form trench openings in the upper layer with a pattern of the first wiring structure 121. The first selective etch may stop, for example, on an etch stop layer between the first ILD layers 121. Thereafter, a second selective etch is performed into the lower layer of the first ILD layers 121 to form via openings in the lower layer with a pattern of the first device contact structure 124. A conductive layer is formed filling the via and trench openings, and a planarization is performed to planarize an upper or top surface of conductive layer with an upper or top surface of the upper layer of the first ILD layers 121, whereby the first wiring structure 122 and the first device contact structure 124 are formed from the conductive layer. The first and second selective etches may be performed selectively by, for example, photolithography, and/or the planarization may be performed by, for example, chemical mechanical polish (CMP).

While the acts performed in FIG. 6 illustrate and describe a dual-damascene-like process for forming the first wiring structure 122 and the first device contact structure 124, a single-damascene-like process may alternatively be employed to form the first wiring structure 122 and the first device contact structure 124 in other embodiments. A dual-damascene-like process and a single-damascene-like process are respectively dual-damascene and single-damascene processes that are not restricted to copper.

Figure 7:
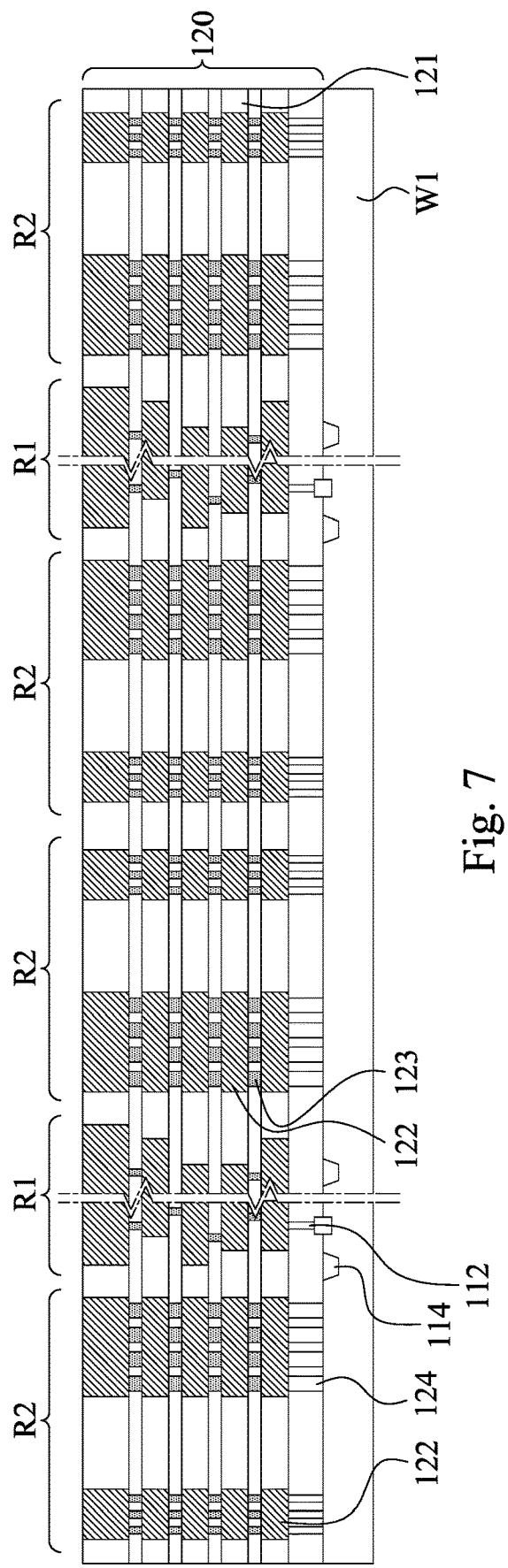

As illustrated in FIG. 7, the dual-damascene-like processes or single-damascene-like processes are repeated one or more times. As such, additional first ILD layers 121 are formed stacked over the first wafer W1, each accommodating an additional first wiring structure 122 and a first inter-wire via structure 123. Collectively, the first ILD layers 121, the first wiring structures 122, the first inter-wire via structures 123 and the first device contact structure 124 define a first interconnect structure 120. The first wiring structures 122 and the first inter-wire via structures 123 formed in the acts of FIG. 7 are formed in either the device regions R1 or ring-shaped regions R2, and portions of the first wiring structures 122 and the first inter-wire via structures 123 in the ring-shaped regions R2 are formed with a pattern of a seal ring (e.g. the seal ring 300 as shown in FIGS. 1 and 2).

Figure 8:
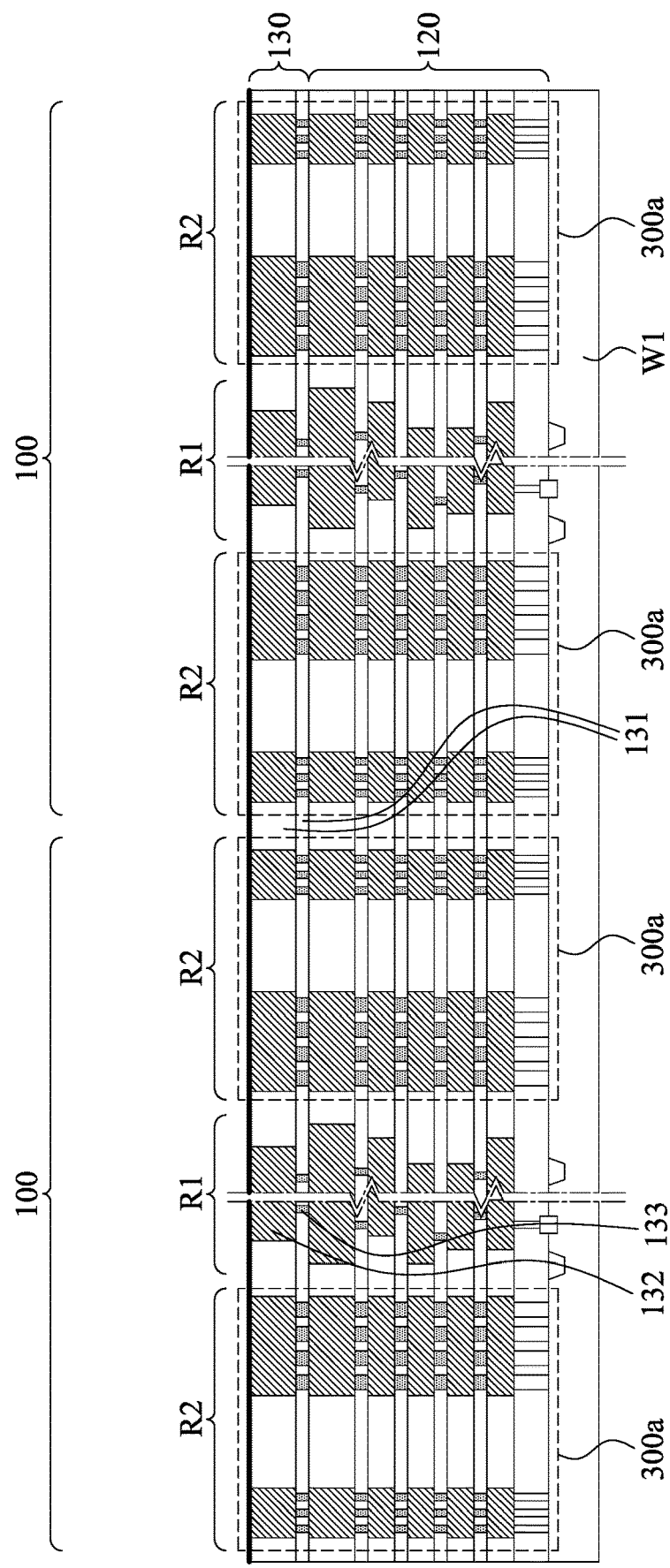
Figure 9:
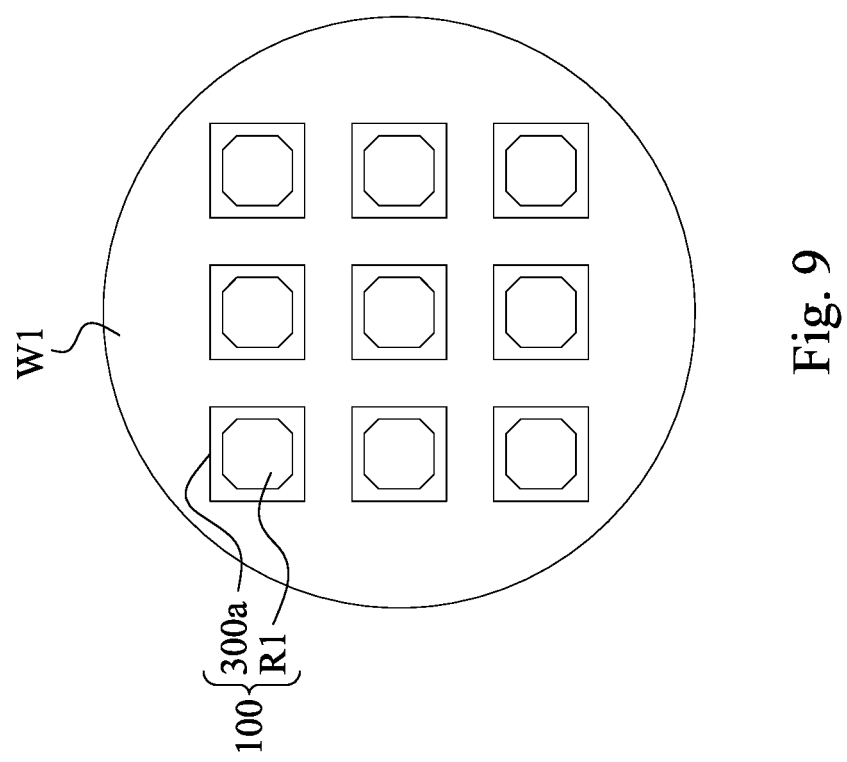

As illustrated in FIG. 8, first HB dielectric layers 131 are formed over the first interconnect structure 120. For example, a lower layer of the first HB dielectric layers 131 is formed covering the first interconnect structure 120, and an upper layer of the first HB dielectric layers 131 is subsequently formed covering the lower layer. The first HB dielectric layers 131 may be formed, for example, in the same manner or a similar manner as described for the first ILD layers 121.

In some embodiments, an etch stop layer (not shown) is formed between the first HB dielectric layers 131. The etch stop layer is a different material than the first HB dielectric layers 131 and may be, for example, silicon nitride, silicon oxynitride or the like. Further, in some embodiments, the first HB dielectric layers 131 are integrated together and/or are the same material. For example, the first HB dielectric layers 131 may be different regions of the same deposition or growth.

A first HB link layer 132 and a first HB contact structure 133 are formed respectively in the first HB dielectric layers 131. For example, the first HB link layer 132 may be formed embedded into an upper layer of the first HB dielectric layers 131, and the first HB contact structure 133 may be formed extending from the first HB link layer 132, through the lower layer of the first HB dielectric layers 131, to the first interconnect structure 120. Collectively, the first HB dielectric layers 131, the first HB link layer 132, and the first HB contact structure 133 define a first HB structure 130.

In some embodiments, the process for forming the first HB link layer 132 and the first HB contact structure 133 is performed in the same manner or a similar manner as described for the first wiring structure 122 and the first device contact structure 124 in FIG. 6. Further, while the acts of FIG. 8 illustrate and describe a dual-damascene-like process for forming the first HB link layer 132 and the first HB contact structure 133, a single-damascene-like process may alternatively be employed to form the first HB link layer 132 and the first HB contact structure 133 in other embodiments.

The first HB link layer 132 and the first HB contact structure 133 are formed in either the device regions R1 or ring-shaped regions R2, and portions of the first HB link layer 132 and the first HB contact structure 133 in the ring-shaped regions R2 are formed with a pattern of a seal ring (e.g. the seal ring 300 as shown in FIGS. 1 and 2). The first HB link layer 132, the first HB contact structure 133, the first wiring structures 122, the first inter-wire via structures 123 and the first device contact structure 124 in the ring-shaped regions R2 collectively define first seal rings 300a. The first seal rings 300a laterally enclose respective device regions R1, as illustrated in the FIGS. 8 and 9. Devices in a device region R1 and a corresponding first seal ring 300a can serve as a first IC die 100. First seal rings 300a of the first IC dies 100 are spaced apart by a dielectric structure including the first ILD layers 121 and the first HB dielectric layers 131.

After formation of the first HB structure 130, a surface treatment can be performed on the surface of the first HB structure 130 in some embodiments. The surface treatment may include, for example, a plasma treatment and/or an acid treatment. When the acid treatment is performed, a top surface of the first HB link layer 132 and a top surface of the first HB dielectric layer 131 are treated with an acid, which may include, for example, formic acid (HCOOH). Through the acid, the metal oxide on the top surface of the first HB link layer 132 may be removed. Some particles and undesirable substances on the top surfaces of the first HB link layer 132 and the first HB dielectric layer 131 are also removed.

The plasma treatment may be performed in a vacuum environment (a vacuum chamber. The process gas used for generating the plasma may include a first combined gas of hydrogen ($H_2$) and argon (Ar), a second combined gas of $H_2$ and nitrogen ($N_2$), or a third combined gas of $H_2$ and helium (He). In some exemplary embodiments, the flow rate ratio of $H_2$ in the first, the second, or the third combined gas, whichever is used in the plasma treatment, may be between about 4 percent and about 5 percent. The hydrogen helps reduce the metal oxide on the top surface of first HB link layer 132 back to metal. Furthermore, through the treatment, the number of OH groups at the top surface of the first HB dielectric layer 131 is increased, which is beneficial for forming a strong dielectric-to-dielectric bond (e.g. strong fusion bond). The plasma treatment may also be performed using pure or substantially pure $H_2$, Ar, or $N_2$, as the process gas, which treats the top surfaces of first HB link layer 132 and the first HB dielectric layer 131 through bombardment. The plasma used in the treatment may be low-power plasma, with the power for generating the plasma between about 10 Watts and about 2,000 Watts, as examples. In the surface treatment, partially due to the low power, the surface roughness of the first HB link layer 132 and the first HB dielectric layer 131 are not changed compared to before the surface treatment.

After the surface treatment, a surface cleaning process is performed on first HB structure 130. In some exemplary embodiments, the surface cleaning includes De-Ionized (DI) water rinsing, with DI water being sprayed onto the surface of first HB structure 130. In alternative embodiments, the surface cleaning is performed using Ammonium Hydroxide ($NH_4OH$).

As illustrated in FIG. 10, the second IC dies 200 are formed on a second wafer W2 in the same manner or a similar manner as described for the first IC dies 100 in FIGS. 4-7. For example, a second interconnect structure 220 is formed over the second wafer W2, and a second HB structure 230 is formed over the second interconnect structure 220. The second interconnect structure 220 comprises second ILD layers 221, as well as second wiring structures 222, second inter-wire via structures 223 and a second device contact structure 224 respectively in the second ILD layers 221. The second HB structure 230 comprises second HB dielectric layers 231, as well as a second HB link layer 232 and a second HB contact structure 233 respectively in the second HB dielectric layers 231. The second wiring structures 222, the second inter-wire via structures 223, the second device contact structure 224, the second HB link layer 232 and the second HB contact structure 233 are formed in either device regions R3 or ring-shaped regions R4 of the second wafer W2.

The second HB link layer 232, the second HB contact structure 233, the second wiring structures 222, the second inter-wire via structures 223 and the second device contact structure 224 in the ring-shaped regions R4 collectively define second seal rings 300b. The second seal rings 300b laterally enclose respective device regions R3, as illustrated in the FIGS. 10 and 11. Devices in a device region R3 and a corresponding second seal ring 300b can serve as a second IC die 200. Second seal rings 300b of the second IC dies 200 are spaced apart by a dielectric structure including the second ILD layers 221 and the second HB dielectric layers 231. After formation of the second HB structure 230, a surface treatment and a surface cleaning process can be performed in sequence on a top surface of the second HB structure 230. The surface treatment and surface cleaning process are essentially the same as that performed on the first HB structure 130, as described above.

Afterwards, as illustrated in FIGS. 12 and 13, the second wafer W2 is flipped and bonded to the first wafer W1, such that the first and second HB structures 130 and 230 interface to define a hybrid bond. The hybrid bond includes a dielectric-to-dielectric bond between the first and second HB dielectric layers 131 and 231, and a conductor-to-conductor bond between the first and second HB link layers 132 and 232. Due to the hybrid bond, the first IC dies 100 and respective second IC dies 200 are bonded together to define a plurality of stacks ST, wherein each stack ST includes a first IC die 100 and a second IC die 200 over the first IC die 100. The conductor-to-conductor bond bonds the first and second seal ring 300a and 300b together as the seal ring 300. In some embodiments where the first and second HB link layers 132 and 232 are metals, a metal-to-metal bond is between the first and second HB link layers 132 and 132, and hence the first and second seal rings 300a and 300b are bonded together by the metal-to-metal bond.

In some embodiments, the bonding process includes a pre-bonding process followed by an annealing process. During the pre-bonding process, a pressing force is applied by a presser to press first and second wafers W1 and W2 against each other. The pressing force may be lower than about 5 Newton, which may be applied to the centers of the first and second wafers W1 and W2, in some embodiments. The pre-bonding may be performed at the room temperature (for example, close to about 21° C.), although higher temperatures may be used. The pre-bonding time may be shorter than about 1 minute, for example. After the pre-bonding, the first and second HB link layers 132 and 232 are bonded to each other through a conductor-to-conductor bond, and the first and second HB dielectric layers 131 and 231 are bonded to each other through a fusion bond.

After the pre-bonding process, an annealing process is performed to improve the bonding strength of the first and second HB structures 130 and 230. During the annealing process, the temperatures of first and second wafers W1 and W2 may be increased, for example, to higher than about 200° C., and may be between about 300° C. and about 450° C., in order to anneal the conductor-to-conductor bond between first and second HB link layers 132. The duration of the annealing process may be between about 0.5 hours and about 4 hours, as examples. The annealing results in the inter-diffusion of the first and second HB link layers 132 and 232, and hence enhancement of the bonding between first and second HB link layers 132 and 232 can be achieved.

The first and second HB link layers 132 and 232 formed of conductors (e.g. metals), however, have greater Coefficients of Thermal Expansion (CTEs) than the first and second HB dielectric layers 131 and 132. Accordingly, with the elevated temperature of the thermal compressive annealing, the first and second HB link layers 132 and 232 expand more than the first and second HB link layers 131 and 231, and tend to protrude out of the surfaces of the respective first and second HB dielectric layers 131 and 231. As a result, the first and second HB dielectric layers 131 and 231 tend to delaminate from each other. Therefore, the first and second HB dielectric layers 131 and 231 have a higher tendency to delaminate from each other compared with the first and second HB link layers 132 and 232. Such a tendency would result in delamination of the first and second HB dielectric layers 131 and 132 in subsequent processes, such as a die saw process.

The dielectric structures (e.g. a combination of first ILD layers 121, first HB dielectric layer 131, second ILD layers 221 and second HB dielectric layer 231) between the stacks ST may be act as scribe line regions SC. The stacks ST can be singulated along the scribed line regions SC by a cutting apparatus, such as a laser or a die saw, and the resulting structure is shown in FIG. 14, wherein individual stacks ST each includes a 3D IC 10 enclosed by the seal ring 300. Since the first and second HB dielectric layers 131 and 231 have a higher tendency to delaminate from each other compared with the first and second HB link layers 132 and 232, the first and second HB dielectric layers 131 and 231 may delaminate from each other during or after the singulation process, and the delamination begins from the scribe line regions SC to form a gap G between the first and second HB dielectric layers 131 and 231. However, since the first and second HB link layers 132 and 232 have a lower tendency to delaminate from each other compared with the first and second HB dielectric layers 131 and 132, the first and second HB link layers 132 and 232 of the seal ring 300 do not delaminate, and hence the gap G does not extend into the seal ring 300 and the 3D IC 10. Therefore, the seal ring 300 can protect the 3D IC 10 from delamination.

Figure 15:
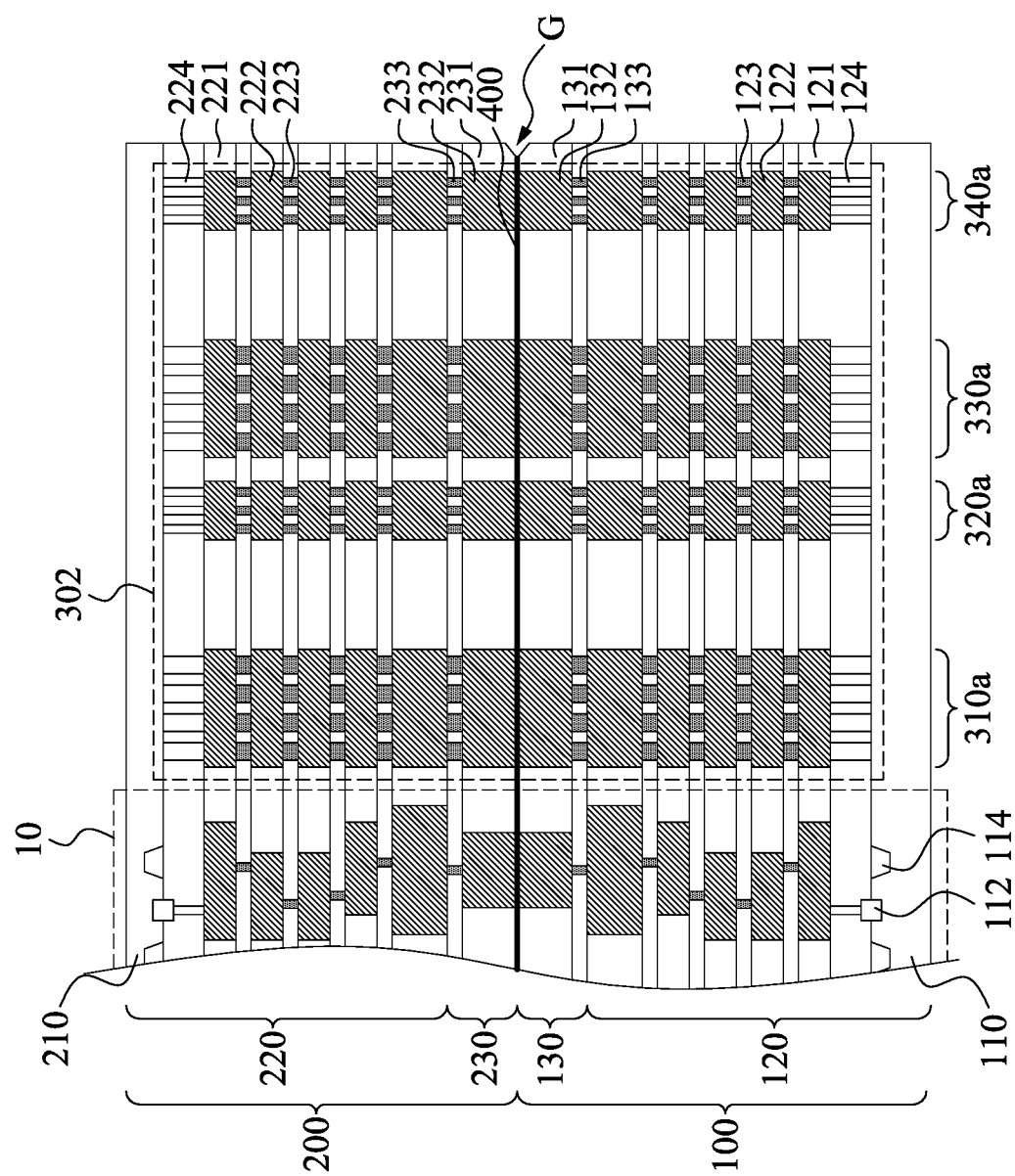
FIG. 15 is a cross-sectional view of a seal ring in accordance with some embodiments of the present disclosure.

FIGS. 15 and 16 illustrate an exemplary triangular pattern T of a seal ring 302, wherein FIG. 15 is a cross-sectional view of the seal ring 302 in accordance with some embodiments of the present disclosure, and a top view of the seal ring 302 is illustrated in FIG. 16 without illustrating the second IC die 200. As shown in FIGS. 15 and 16, the seal ring 302 includes first, second third and fourth ring-shaped structures 310a, 320a, 330a and 340a that are arranged concentrically. The second ring-shaped structure 320a has a triangularly-shaped section 322a between first and third ring-shaped structures 310a and 330a. In some embodiments, the triangularly-shaped section 322a is shaped as an isosceles triangle with legs of the triangle running substantially parallel to the legs of the third ring-shaped structure 330a and the hypotenuse of the triangle running parallel to a section of the first ring-shaped structure 310a. In some embodiments, the second ring-shaped structure 320a has linearly-shaped sections 321a and 323a respectively extending from the legs of the triangularly-shaped section 322a and running substantially parallel to the legs of the third ring-shaped structure 330a. Such a combination of first, second, third, and fourth ring-shaped structures 310a, 320a, 330a and 340a provides triangular patterns at corners of the seal ring 302 and thus provides increased prevention of delamination at the corner of the 3D IC 10, which has been more susceptible to delamination from mechanical singulation processes. For example, the seal ring 302 has greater width at its corner than at its sides due to the triangularly-shaped section 322a, and hence delamination of the first and second HB dielectric layers 131 and 231 at the corner can be further prevented.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that delamination occurs at the HB interface outside the seal ring does not extend into the seal ring because the conductor layers in the seal ring has lower tendency to delaminate from each other compared with the dielectric layers outside the seal ring. Another advantage is that the seal ring can provide improved protection if the seal ring extends from one semiconductor substrate to another semiconductor substrate. The stacked structure of two dies (or two wafers) as discussed above is merely an example for describing the seal ring. The seal ring described above can also be integrated into other devices, such as a stacked structure of three or more dies (or wafers), stacked logic devices, stacked flash devices, stacked high voltage (HV) devices, stacked fin type field effect transistors (FinFETs), or the like.

In some embodiments, a device includes first and second dies and a seal ring. The first die includes a top dielectric layer. The second die is over the first die. The second die includes a bottom dielectric layer bonded to the top dielectric layer of the first die at an interface between the first die and the second die. The seal ring extends from the first die to the second die through the interface. A portion of the top dielectric layer of the first die and a portion of the bottom dielectric layer of the second die are separated by a gap outside the seal ring.

In some embodiments, the seal ring has a triangular pattern at a top surface of the first die.

In some embodiments, the triangular pattern is further at a corner of the seal ring.

In some embodiments, the seal ring includes a first conductive structure and a second conductive structure bonded to the first conductive structure.

In some embodiments, the device further includes a metal-to-metal bond in the seal ring.

In some embodiments, the metal-to-metal bond is at the interface between the first die and the second die.

In some embodiments, the first die further includes a first semiconductor substrate under the top dielectric layer, and the seal ring is in contact with the first semiconductor substrate.

In some embodiments, the second die further includes a second semiconductor substrate over the bottom dielectric layer, and the seal ring is further in contact with the second semiconductor substrate.

In some embodiments, the seal ring includes a first wiring structure and a second wiring structure in the first die, wherein the first wiring structure and the second wiring structure are arranged in a direction from the first die toward the second die, and wherein the second wiring structure is thicker than the first wiring structure.

In some embodiments, the seal ring further includes a third wiring structure and a fourth wiring structure in the second die, wherein the third wiring structure and the fourth wiring structure are arranged in the direction from the first die toward the second die, and the third wiring structure is thicker than the fourth wiring structure.

In some embodiments, a device includes first and second dies, a seal ring and a dielectric structure. The first die includes a first interconnect structure and a first hybrid bond (HB) structure over the first interconnect structure. The second die is over the first die. The second die includes a second HB structure and a second interconnect structure over the second HB structure. The second HB structure contacts the first HB structure at a HB interface. The seal ring is in the first and second dies and across the HB interface. The dielectric structure extends along an outer side of the seal ring and has a gap therein.

In some embodiments, the gap does not extend into the seal ring.

In some embodiments, the seal ring has a triangular pattern at a bottom surface of the second die.

In some embodiments, the triangular pattern is further at a corner region of the seal ring.

In some embodiments, the seal ring includes a metal across the HB interface.

In some embodiments, the seal ring defines a conductive path through the first HB structure and the second HB structure.

In some embodiments, a method includes forming a plurality of first dies on a first wafer, wherein the forming each of the first dies comprises forming a first seal ring in the first die; forming a plurality of second dies on a second wafer, wherein the forming each of the second dies comprises forming a second seal ring in the second die; bonding the second wafer to the first wafer, such that the second seal rings are respectively in contact with the first seal rings; and sawing the first and second wafers, such that a first dielectric structure between the first seal rings is separated.

In some embodiments, the bonding the second wafer to the first wafer includes bonding a second dielectric structure between the second seal rings to the first dielectric structure.

In some embodiments, the first dielectric structure is separated from the second dielectric structure by a gap after the sawing the first and second wafers.

In some embodiments, the sawing the first and second wafers includes separating the second dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first die comprising a top dielectric layer;
   a second die over the first die, the second die comprising
     a bottom dielectric layer bonded to the top dielectric layer of the first die at an interface between the first die and the second die; and
   a seal ring extending from the first die to the second die through the interface, wherein a portion of the top dielectric layer of the first die and a portion of the bottom dielectric layer of the second die are separated by a gap outside the seal ring.

2. The device of claim 1, wherein the seal ring has a triangular pattern at a top surface of the first die.

3. The device of claim 2, wherein the triangular pattern is further at a corner of the seal ring.

4. The device of claim 1, wherein the seal ring comprises a first conductive structure and a second conductive structure bonded to the first conductive structure.

5. The device of claim 1, further comprising:
   a metal-to-metal bond in the seal ring.

6. The device of claim 5, wherein the metal-to-metal bond is at the interface between the first die and the second die.

7. The device of claim 1, wherein the first die further comprises a first semiconductor substrate under the top dielectric layer, and the seal ring is in contact with the first semiconductor substrate.

8. The device of claim 7, wherein the second die further comprises a second semiconductor substrate over the bottom dielectric layer, and the seal ring is further in contact with the second semiconductor substrate.

9. The device of claim 1, wherein the seal ring comprises a first wiring structure and a second wiring structure in the first die, wherein the first wiring structure and the second wiring structure are arranged in a direction from the first die toward the second die, and wherein the second wiring structure is thicker than the first wiring structure.

10. The device of claim 9, wherein the seal ring further comprises a third wiring structure and a fourth wiring structure in the second die, wherein the third wiring structure and the fourth wiring structure are arranged in the direction, and wherein the third wiring structure is thicker than the fourth wiring structure.

11. A device, comprising:
    a first die comprising a first interconnect structure and a first hybrid bond (HB) structure over the first interconnect structure;
    a second die over the first die, the second die comprising
      a second HB structure and a second interconnect structure over the second HB structure, the second HB structure contacting the first HB structure at a HB interface;

a seal ring in the first and second dies and across the HB interface; and a dielectric structure extending along an outer side of the seal ring and having a gap therein.

12. The device of claim 11, wherein the gap does not extend into the seal ring.

13. The device of claim 11, wherein the seal ring has a triangular pattern at a bottom surface of the second die.

14. The device of claim 13, wherein the triangular pattern is further at a corner region of the seal ring.

15. The device of claim 11, wherein the seal ring includes a metal across the HB interface.

16. The device of claim 11, wherein the seal ring defines a conductive path through the first HB structure and the second HB structure.

17. A method, comprising:

forming a plurality of first dies on a first wafer, wherein the forming each of the first dies comprises forming a first seal ring in the first die, wherein the first seal ring has a triangular pattern at a top surface of the first die;

forming a plurality of second dies on a second wafer, wherein the forming each of the second dies comprises forming a second seal ring in the second die;

bonding the second wafer to the first wafer, wherein the second seal rings are respectively in contact with the first seal rings when bonding the second wafer to the first wafer; and sawing the first and second wafers, such that a first dielectric structure between the first seal rings is separated.

18. The method of claim 17, wherein the bonding the second wafer to the first wafer includes bonding a second dielectric structure between the second seal rings to the first dielectric structure.

19. The method of claim 18, wherein the first dielectric structure is separated from the second dielectric structure by a gap after the sawing the first and second wafers.

20. The method of claim 18, wherein the sawing the first and second wafers includes separating the second dielectric structure.

* * * * *